(12) United States Patent
Choi et al.

(10) Patent No.: US 11,244,938 B2
(45) Date of Patent: *Feb. 8, 2022

(54) ELECTRONIC DEVICE PACKAGE

(71) Applicant: SAMSUNG ELECTRONICS CO., LTD., Suwon-si (KR)

(72) Inventors: Ju-Youn Choi, Hwaseong-si (KR); Eun-Seok Song, Hwaseong-si (KR); Seung-Yong Cha, Hwaseong-si (KR); Yun-Hee Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 88 days.

This patent is subject to a terminal disclaimer.

(21) Appl. No.: 16/554,818

(22) Filed: Aug. 29, 2019

(65) Prior Publication Data

US 2019/0385997 A1 Dec. 19, 2019

Related U.S. Application Data

(63) Continuation of application No. 15/696,973, filed on Sep. 6, 2017, now Pat. No. 10,424,571.

(30) Foreign Application Priority Data

Dec. 30, 2016 (KR) ........................ 10-2016-0184354

(51) Int. Cl.
*H01L 25/18* (2006.01)
*H01L 23/538* (2006.01)
(Continued)

(52) U.S. Cl.
CPC ......... *H01L 25/18* (2013.01); *H01F 17/0006* (2013.01); *H01F 27/24* (2013.01);
(Continued)

(58) Field of Classification Search
CPC ........... H01L 23/5386; H01L 23/49816; H01L 23/5385; H01L 23/5381; H01L 25/18; H01L 25/0657
See application file for complete search history.

(56) References Cited

U.S. PATENT DOCUMENTS 7,120,031 B2 10/2006 Chakravorty et al.
7,599,190 B2 10/2009 Okubora
(Continued)

FOREIGN PATENT DOCUMENTS

WO WO2014078131 A1 5/2014
WO WO2014149851 A1 9/2014

OTHER PUBLICATIONS

Taiwan Office Action dated Feb. 9, 2021 Cited in Taiwanese Application No. 106145732.

*Primary Examiner* — Hoa B Trinh
(74) *Attorney, Agent, or Firm* — Volentine, Whitt & Francos, PLLC

(57) ABSTRACT

An electronic device package includes a package substrate, an interposer located above the package substrate and electrically connected to the package substrate, a processing device located above the interposer and electrically connected to the interposer, at least one high bandwidth memory device located above the interposer and electrically connected to the interposer and the processing device, a power management integrated circuit device located above the interposer and electrically connected to the interposer and the processing device, and a passive device located on or inside the interposer and electrically connected to the power management integrated circuit device.

12 Claims, 15 Drawing Sheets

(51) Int. Cl.
*H01F 27/28* (2006.01)
*H01F 27/24* (2006.01)
*H01L 25/065* (2006.01)
*H01F 17/00* (2006.01)
*H01L 23/498* (2006.01)
*H01L 23/00* (2006.01)

(52) U.S. Cl.
CPC ..... *H01F 27/2804* (2013.01); *H01L 23/5383* (2013.01); *H01L 23/5386* (2013.01); *H01L 25/0657* (2013.01); *H01F 2017/0066* (2013.01); *H01F 2017/0073* (2013.01); *H01L 23/49816* (2013.01); *H01L 23/5381* (2013.01); *H01L 23/5385* (2013.01); *H01L 24/16* (2013.01); *H01L 2224/16145* (2013.01); *H01L 2224/16225* (2013.01); *H01L 2224/16227* (2013.01); *H01L 2224/16235* (2013.01); *H01L 2224/17181* (2013.01); *H01L 2225/0652* (2013.01); *H01L 2225/06517* (2013.01); *H01L 2225/06541* (2013.01); *H01L 2225/06548* (2013.01); *H01L 2225/06586* (2013.01); *H01L 2924/14* (2013.01); *H01L 2924/1427* (2013.01); *H01L 2924/1432* (2013.01); *H01L 2924/1434* (2013.01); *H01L 2924/15192* (2013.01); *H01L 2924/15311* (2013.01); *H01L 2924/19011* (2013.01); *H01L 2924/19041* (2013.01); *H01L 2924/19042* (2013.01)

(56) References Cited

U.S. PATENT DOCUMENTS

| | | | |
|---|---|---|---|
| 8,471,358 | B2 | 6/2013 | Yen et al. |
| 8,773,866 | B2 | 7/2014 | Jin et al. |
| 9,101,068 | B2 | 8/2015 | Yun et al. |
| 9,370,103 | B2 | 6/2016 | Yun et al. |
| 9,406,597 | B2 | 8/2016 | Chi et al. |
| 9,406,648 | B2 | 8/2016 | Wang et al. |
| 9,406,738 | B2 | 8/2016 | Kireev et al. |
| 9,502,390 | B2 | 11/2016 | Caskey et al. |
| 10,424,571 | B2 * | 9/2019 | Choi ................... H01F 27/2804 |
| 2013/0221485 | A1 | 8/2013 | Kim et al. |
| 2015/0380388 | A1 | 12/2015 | Yu et al. |
| 2016/0071818 | A1 | 3/2016 | Wang et al. |
| 2018/0076112 | A1* | 3/2018 | Dabral ................... H01L 23/28 |
| 2018/0102776 | A1* | 4/2018 | Chandrasekar ......... H01L 25/18 |

* cited by examiner

ELECTRONIC DEVICE PACKAGE

PRIORITY STATEMENT

This is a Continuation of U.S. application Ser. No. 15/696,973, filed Sep. 6, 2017, now U.S. Pat. No. 10,424,571 issued on Sep. 24, 2019, which claims the benefit of Korean Patent Application No. 10-2016-0184354, filed on Dec. 30, 2016, in the Korean Intellectual Property Office, the disclosure of which is hereby incorporated by reference in its entirety.

BACKGROUND

The inventive concept relates to an electronic device package, and more particularly, to an electronic device package including an integrated circuit device, a memory device, and a passive device.

In electronic device packages, an electronic component, e.g., an integrated circuit, a memory, a passive device, or the like is mounted on a board substrate or a package substrate. Because there is a demand for smaller and more compact electronic devices, components of electronic devices such as integrated circuits are becoming more integrated. Accordingly, there is a need to reduce the size or "footprint" of a mounting area for electronic components on a board substrate or a package substrate.

SUMMARY

According to an aspect of the inventive concept, there is provided an electronic device package including a package substrate, an interposer located above the package substrate and electrically connected to the package substrate, a processing device located above the interposer and electrically connected to the interposer, at least one high bandwidth memory device located above the interposer and electrically connected to the interposer and the processing device, a power management integrated circuit device located above the interposer and electrically connected to the interposer and the processing device, and a passive device located on or inside the interposer and electrically connected to the power management integrated circuit device.

According to another aspect of the inventive concept, there is provided an electronic device package including a package substrate, a lower interposer located above the package substrate and electrically connected to the package substrate, an upper interposer located above the lower interposer and electrically connected to the lower interposer, a processing device located above the upper interposer and electrically connected to the upper interposer, at least one high bandwidth memory device located above the upper interposer and electrically connected to the processing device, a power management integrated circuit device located above the upper interposer and electrically connected to the upper interposer and the processing device, and a passive device located inside the lower interposer and the upper interposer and electrically connected to the power management integrated circuit device.

According to another aspect of the inventive concept, there is provided an electronic device package including a package substrate, a lower interposer located above the package substrate and electrically connected to the package substrate, an intermediate interposer located above the lower interposer and electrically connected to the lower interposer, an upper interposer located above the intermediate interposer and electrically connected to the intermediate interposer, a processing device located above the upper interposer and electrically connected to the upper interposer, at least one high bandwidth memory device located above the upper interposer and electrically connected to the processing device, a power management integrated circuit device located inside the intermediate interposer and electrically connected to the upper interposer and the processing device, and a passive device located inside the lower interposer and the intermediate interposer and electrically connected to the power management integrated circuit device.

According to another aspect of the inventive concept, there is provided an electronic device package including a package substrate having a substrate body having top and bottom surfaces, first connection terminals disposed on the substrate body and dedicated to electrically connect the electronic device package to an external device, second connection terminals disposed on the top surface of the substrate body, an interposer disposed on the top surface of the substrate body of the package substrate and electrically connected to the package substrate via the second connection terminals, the interposer including an interposer body and through-vias extending vertically through the interposer body, a processor disposed above the interposer and electrically connected to the through-vias of the interposer, at least one high bandwidth memory disposed above the interposer and electrically connected to the processor by the interposer, a power management integrated circuit electrically connected to the processor, and a passive electronic component disposed on or within the interposer body of the interposer and electrically connected to the power management integrated circuit device.

According to another aspect of the inventive concept, there is provided an electronic device package including a package substrate including a substrate body, connection terminals disposed on the substrate body, a processor, at least one high bandwidth memory, a power management integrated circuit, an intermediate structure including at least one interposer interposed between the package substrate and both the processor and the at least one high bandwidth memory and to which the processor and the at least one high bandwidth memory are mounted, and a passive electronic component disposed on or within the interposer body of a said interposer of the intermediate structure, and in which each interposer includes an interposer body and through-vias extending vertically through the interposer body and electrically connected to the connection terminals of the package substrate, the processor is disposed on the intermediate structure and is electrically connected to the through-vias of the at least one interposer of the intermediate structure so as to be electrically connected to the connection terminals of the package substrate by the at least one interposer, the at least one high bandwidth memory is disposed on the intermediate structure beside the processor and is electrically connected to the processor by the intermediate structure, the passive electronic component is disposed on or within the interposer body of a said interposer of the intermediate structure and is electrically connected to the power management integrated circuit, and the power management integrated circuit is electrically connected to the processor by the intermediate structure.

BRIEF DESCRIPTION OF THE DRAWINGS

The inventive concept will be more clearly understood from the following detailed description of examples thereof taken in conjunction with the accompanying drawings in which.

DETAILED DESCRIPTION

Hereinafter, with reference to the attached drawings, examples of the inventive concept will be described in detail. Furthermore, although the drawings show multiples of certain elements or features, the description may refer to a single such element or feature for the sake of simplicity. Also, various features of the following examples may be used in combination. Accordingly, the inventive concept is not limited to any single one of the disclosed examples.

Figure 1:
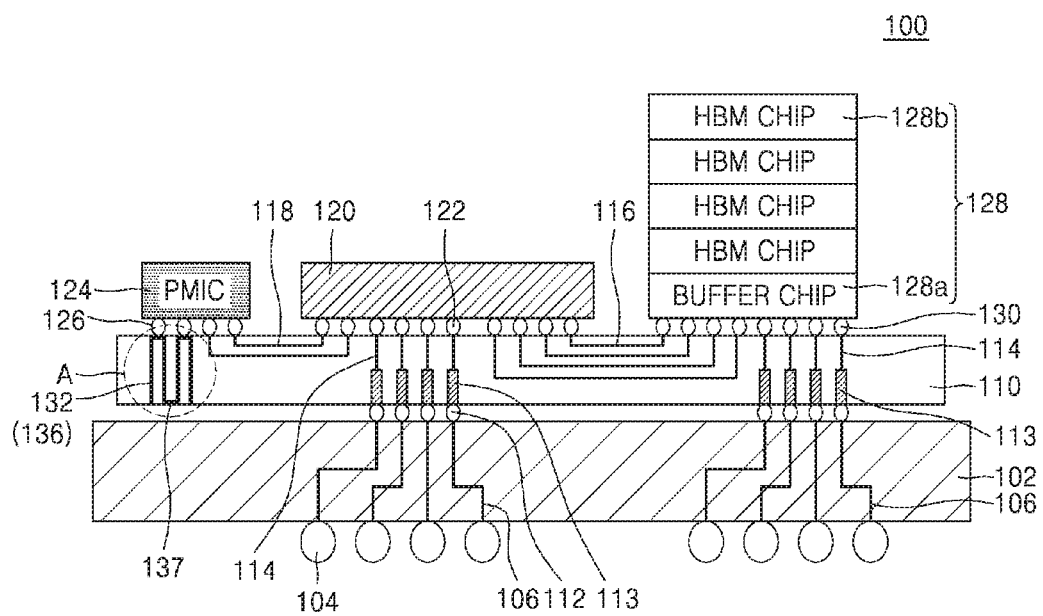
FIG. 1 is a cross-sectional view of an example of an electronic device package according to the inventive concept.

FIG. 1 illustrates a major portion of an electronic device package 100 according to the inventive concept.

The electronic device package 100 includes a package substrate 102. The package substrate 102 may be a printed circuit board. A first connection terminal 104 may be disposed under the package substrate 102. The first connection terminal 104 may be a solder bump or a solder ball. The package substrate 102 may have a substrate body and a first interconnection layer 106 disposed inside the substrate body of the package substrate 102. The first interconnection layer may comprise a conductive wiring pattern. For convenience, only a portion of the first interconnection layer 106 is illustrated.

An interposer 110 may be located above the package substrate 102. The interposer 110 may be electrically connected to the package substrate 102. The interposer 110 has an interposer body which may be referred to as an interposer substrate. The interposer body may be a silicon substrate. A second connection terminal 112 may be disposed under the interposer 110. The second connection terminal 112 may be a solder bump or a solder ball. The interposer 110 may also include a first through-silicon via 113, a second interconnection layer 114, and third interconnection layers 116 and 118. For convenience, the third interconnection layers 116 and 118 are illustrated as if being separated from each other. However, in one or more examples, the third interconnection layers 116 and 118 may be connected to each other. In one example, the third interconnection layers 116 and 118 may be electrically connected to the second interconnection layer 114.

The first through-silicon via 113 may pass through a portion of the interposer 110 between a top surface and a bottom surface of the interposer 110. The second interconnection layer 114 may be electrically connected to the first through-silicon via 113. The first through-silicon via 113 illustrated in FIG. 1 passes through only a portion of the interposer 110 between the top and bottom surfaces of the interposer 110. However, in one example, the first through-silicon via 113 may pass completely through the interposer 110 between the top surface and the bottom surface thereof. The first through-silicon via 113 and the second interconnection layer 114 will be described in detail later.

A passive device 132 is disposed inside the interposer 110. The passive device comprises at least one passive electronic component. As is well understood in the art, the term "passive" as used to describe an electronic component refers to the fact that the component has an intrinsic characteristic in a circuit that does not depend on power being supplied thereto. The passive device 132 may be an inductor. The passive device 132 may include a plurality of second through-silicon vias 136, passing between the top and bottom surfaces of the interposer 110, and a redistribution layer 137 connecting the second through-silicon vias 136. Portion A of the package 100 including the passive device 132 will be described in detail.

A processing device or simply "processor" 120 may be located above the interposer 110, and may be electrically connected to the interposer 110 via a third connection terminal 122. The third connection terminal 122 may be a solder bump or a solder ball. The processing device 120 may be a control chip that controls the electronic device package 100.

The processing device 120 may include at least one active device disposed on a wafer. The wafer may include an elemental semiconductor, a compound semiconductor, or an alloy semiconductor. Examples of the elemental semiconductor are silicon and germanium. Examples of the compound semiconductor include silicon carbide, gallium arsenide, gallium phosphide, indium phosphide, indium arsenide, and indium antimonide. Examples of the alloy semiconductor may include SiGe, GaAsP, AlInAs, AlGaAs, GaInAs, GaInP, GaInAsP, and combinations thereof.

In one or more examples, the wafer may include a non-semiconductor material. Examples of the non-semiconductor material include glass, fused quartz, potassium fluoride, and combinations thereof. Examples of the active device are a transistor and a diode. Examples of the transistor include a metal-oxide-semiconductor field-effect transistor (MOSFET), a complementary metal-oxide-semiconductor (CMOS) transistor, a bipolar junction transistor (BJT), a high voltage transistor, a high frequency transistor, a p-type channel field-effect transistor and/or an n-type channel field-effect transistor (PFET/NFET), a FinFET, and a planar MOS transistor with a raised source/drain.

In one or more examples, the processing element 120 may include a central processing unit (CPU), a graphics processing unit (GPU), and a digital signal processor (DSP). The processing element 120 may include an application processor (AP). In one or more examples, the AP may be a wireless communication application or an application-specific IC (ASIC).

A high bandwidth memory (HBM) device 128 is mounted above the interposer 110, and is electrically connected to the processing device 120 via the third interconnection layer 116. The HBM device 128 includes at least one high bandwidth memory (HBM). The HBM device 128 may be electrically connected to the interposer 110 via a fourth connection terminal 130. The HBM device 128 may be a stack of chips including a buffer chip 128a and an HBM chip 128b, and these chips may be connected via a chip through-silicon via (see 140 of FIG. 5).

As one example, the HBM device 128 illustrated in FIG. 1 includes four HBM chips 128b. The HBM device 128 including the four HBM chips 128b may have a bandwidth of 100 GB/s (gigabytes/second) or more. In one example, the HBM device 128 includes eight HBM chips 128b. The HBM device 128 including the eight HBM chips 128b may have a bandwidth of 256 GB/s (gigabytes/second) or more.

A power management integrated circuit (PMIC) device 124 or simply "power management integrated circuit" may be located above the interposer 110, and may be electrically connected to the interposer 110 and the processing element 120 via the third interconnection layer 118. The PMIC device 124 may be connected to the passive device 132 located therebelow via a fifth connection terminal 126.

A power management integrated circuit (PMIC), as the name implies, receives power supplied to the package device 100 and controls and manages the supply of power to the electronic components of the package device. In this example, the PMIC device 124 provides and controls power to the processing device 120 and the HBM device 128. When the passive device 132 is connected to the PMIC device 124, power may be controllable and stably provided to the processing device 120 and the HBM device 128. The passive device 132 illustrated in FIG. 1 is an inductor. However, if the application of the package device requires, i.e., in other examples according to the inventive concept, the passive device 132 is a capacitor.

When the passive device 132, e.g., an inductor, is located immediately below the PMIC device 124, the performance of the inductor inside the electronic device package 100 may be improved. However, the passive device 132 may be disposed in areas other than the area immediately below the PMIC device 124.

In the electronic device package 100 according to the inventive concept, an intermediate structure consisting of the interposer 110 is interposed between the package substrate 102 and both the processing device 120 and the HBM device 128. More particularly, the PMIC device 124, the processing device 120, and the HBM device 128 are mounted on the interposer 110, and the passive device 132 may be disposed inside the interposer 110. Accordingly, the footprint of the mounting area across which components are disposed on the package substrate 102 of the electronic device package 100 is minimized, and power may be provided stably (e.g., to the processing and high bandwidth memory devices within the electronic device package 100), thereby maximizing its performance.

Figure 2:
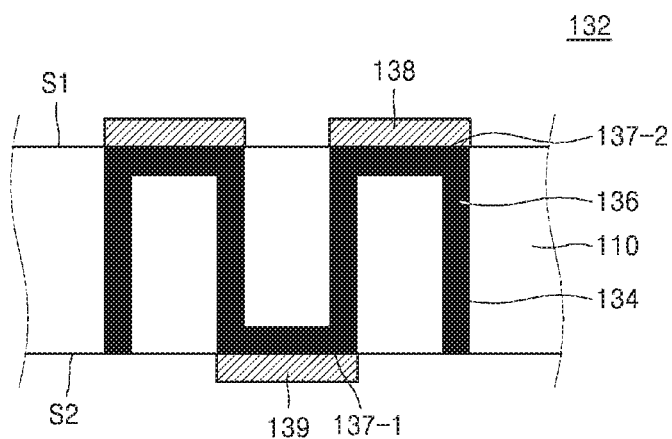
FIG. 2 is an enlarged view of a passive device of the electronic device package of FIG. 1.

FIG. 2 is an enlarged view of the passive device 132 of the electronic device package 100 of FIG. 1.

The passive device 132 may be, as described above, an inductor. The passive device 132 may include the second through-silicon vias 136 filling through-holes 134 passing or extending between a top surface S1 and a bottom surface S2 of the interposer 110, and redistribution layers 137-1 and 137-2 horizontally connecting the second through-silicon vias 136. If needed, redistribution pads 138 and 140 may be disposed on the redistribution layers 137-1 and 137-2.

Figure 3:
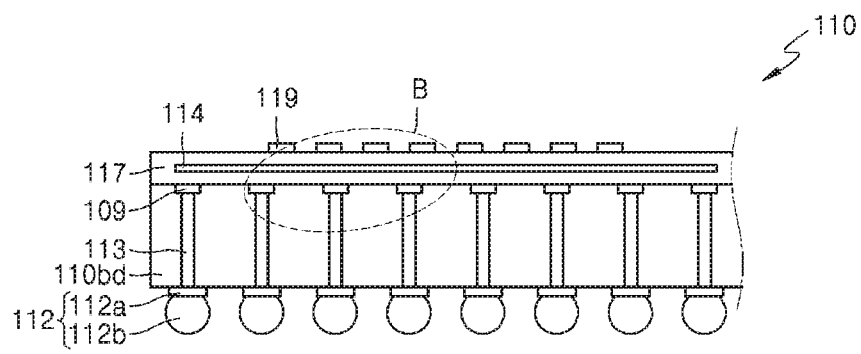
FIG. 3 is an enlarged view of an interposer of the electronic device package of FIG. 1.

FIG. 3 is an enlarged view of the interposer 110 of the electronic device package 100 of FIG. 1.

The interposer 110 may include a body layer 110bd, the first through-silicon via 113, a top pad 109, a top insulating layer 117, the second interconnection layer 114, an interconnection pad 119, and the second connection terminal 112. The interposer 110 may function as a medium for enabling relatively small ones of the processing device 120, the HBM device 128, and the PMIC device 124 to be mounted to the package substrate 102.

The body layer 110bd may function as a supporting substrate. The first through-silicon via 113 may pass through the body layer 110bd, and ends of the first through-silicon via 113 may be connected to a top pad 109 and the second connection terminal 112, respectively. The second connection terminal 112 may include a pad 112a and a solder bump 112b.

The top insulating layer 117 may be disposed on the body layer 110bd and the top pad 109, and may include an insulating material, e.g., an oxide or a nitride. The second interconnection layer 114 may be disposed inside the top insulating layer 117, and may electrically connect the top pad 109 to the interconnection pad 119. The structure of the second interconnection layer 114 will be described in detail in connection with FIG. 4.

The interconnection pad 119 may be disposed on the top insulating layer 117. A distance between adjacent first through-silicon vias 113, a distance between adjacent top pads 109, and a distance between adjacent second connection terminals 112 may each be greater than a distance between adjacent interconnection pads 119. This is because the underlying package substrate 102 is standardized, and thus, the first through-silicon via 113, the top pad 109, and the second connection terminal 112 are disposed so as to correspond to the package substrate 102. The distance mismatch between the top pad 109 and the interconnection pad 119 may be resolved by the second interconnection layer 114.

Figure 4:
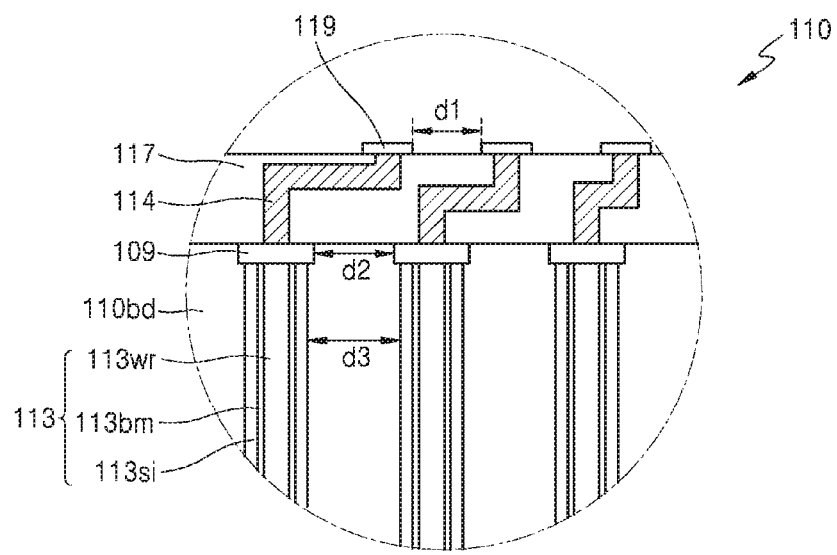
FIG. 4 is an enlarged view of portion "B" of the interposer of FIG. 3

FIG. 4 is an enlarged view of portion "B" of the interposer 110 of FIG. 3

The second interconnection layer 114 may be disposed inside the top insulating layer 117. The top pad 109 may be electrically and/or physically connected to the first through-silicon via 113. A fourth connection terminal (see 130 of FIG. 1) is disposed on the interconnection pad 119, and thus, allows the interposer 110 to be electrically and/or physically connected to the processing device 120 or the HBM device 128. The second interconnection layer 114 may electrically connect the interconnection pad 119 to the top pad 109.

The interconnection pads 119 may be more densely arranged than the top pads 109. For example, a spacing of or distance d1 between adjacent interconnection pads 119 may be smaller than a spacing of or distance d2 of adjacent top pads 109, and the spacing of or distance d1 between adjacent interconnection pads 119 may be smaller than the spacing of or distance d3 between adjacent first through-silicon vias 113. In this case, the second interconnection layer 114 may be a redistribution layer having a redistribution wiring pattern.

The interconnection pad 119 may have a smaller footprint (area) than the top pad 109. The interconnection pad 119 and the top pad 109 may each include a conductive material, e.g., aluminum or copper. The first through-silicon via 113 may include a barrier metal layer 113*bm*, an interconnection metal layer 113*wr*, and a spacer insulating layer 113*si*.

Figure 5:
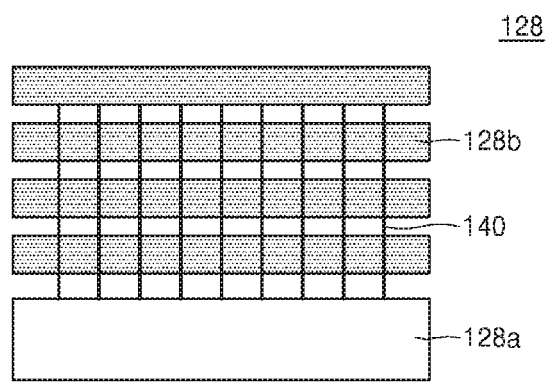
FIG. 5 is an enlarged view of a high bandwidth memory device illustrated of the electronic device package of FIG. 1.

FIG. 5 is an enlarged view of the HBM device 128 of FIG. 1.

As explained in connection with FIG. 1, the HBM device 128 may be electrically connected to the interposer 110 via the fourth connection terminal 130. In the HBM device 128, the HBM chip 128*b* may be stacked on the buffer chip 128*a*. The HBM device 128 may be a stacked structure in which chips are stacked on one another, and the chips of the stacked structure may be connected via a chip through-silicon via 140.

The chip through-silicon via 140 may pass through the buffer chip 128*a* and the HBM chip 128*b*. A pad may be interposed between the buffer chip 128*a* and the HBM chip 128*b* and between adjacent HBM chips 128*b*. However, the pads are not illustrated in FIG. 5 for the purpose of ease of illustration. The number of HBM chips 128*b* stacked in FIG. 5 is four, but the inventive concept is not limited thereto.

Figure 6A:
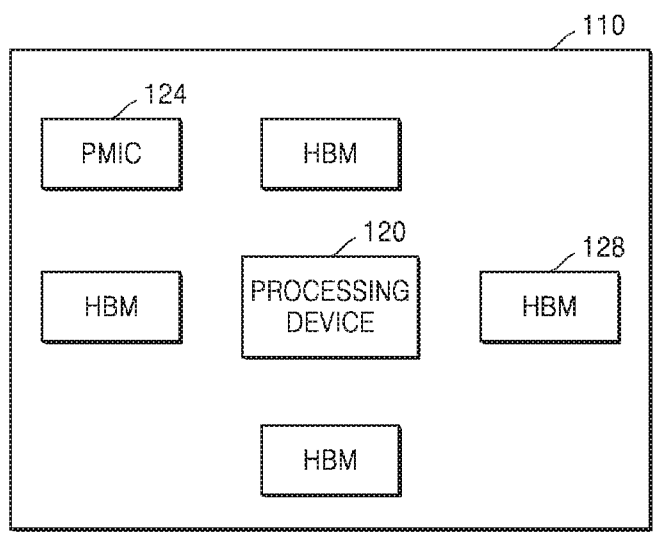
FIGS. 6A, 6B and 6C are layout diagrams of positional relationships of electronic elements of examples of an electronic device package according to the inventive concept.
Figure 6B:
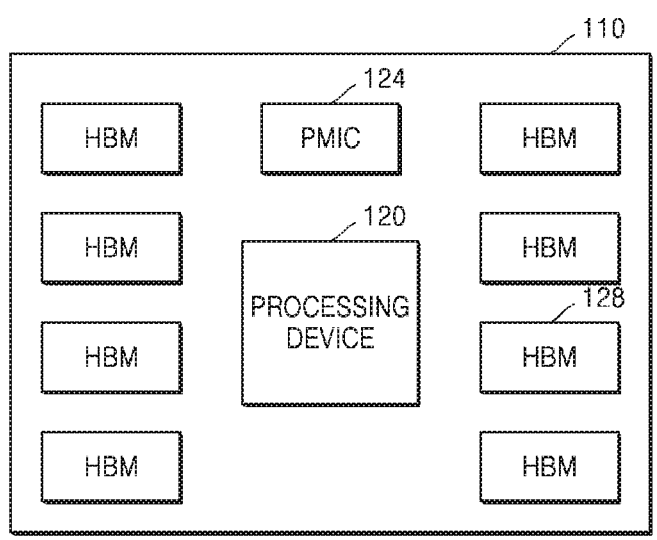
Figure 6C:
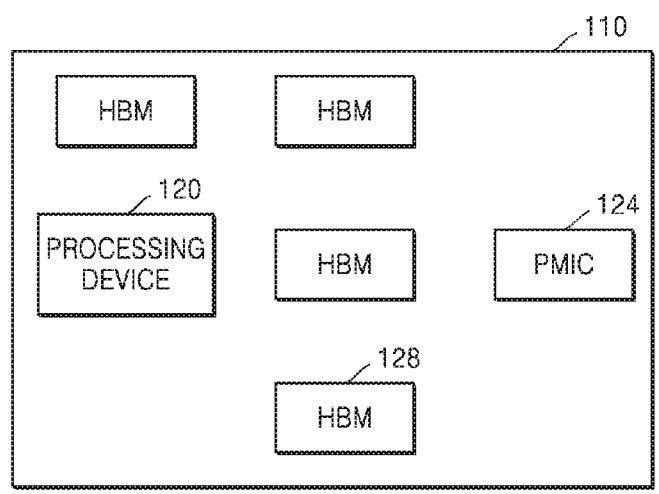

FIGS. 6A to 6C are layout diagrams of examples of positional relationships of electronic elements constituting an electronic device package according to the inventive concept.

In the layout 142 of the electronic device package illustrated in FIG. 6A, the processing device 120 is located at the center of the interposer 110. The HBM devices 128 are located on all fours sides (upper, lower, left, and right in the layout) of the processing device 120. The PMIC device 124 may be located beside two of the HBM devices 128.

In the layout 144 of the electronic device package illustrated in FIG. 6B, the processing device 120 is located at the center of the interposer 110. The HBM devices 128 may be located on opposite sides (at left and right sides in the layout) of the processing device 120. The PMIC device 124 may be located to one side (at a top side in the layout) of the processing device 120 between the opposite sides on which the HBM devices 128 are located.

In the layout 146 of the electronic device package illustrated in FIG. 6C, the processing device 120 is located at a side portion of the interposer 110. The HBM devices 128 may be located around a portion of the processing device 120. The PMIC device 124 may be located to one side of the HBM devices 128 on a side portion of the interposer opposite that at which the processing device 120 is located.

As described above, regarding the layouts 142, 144, and 146 of the electronic device package, a processing device may be disposed on an interposer as horizontally spaced apart from a PMIC device and various arrangements of HBM devices. Layouts other than those illustrated are possible, i.e., the inventive concept is not limited to the examples illustrated in FIGS. 6A to 6C.

Figure 7:
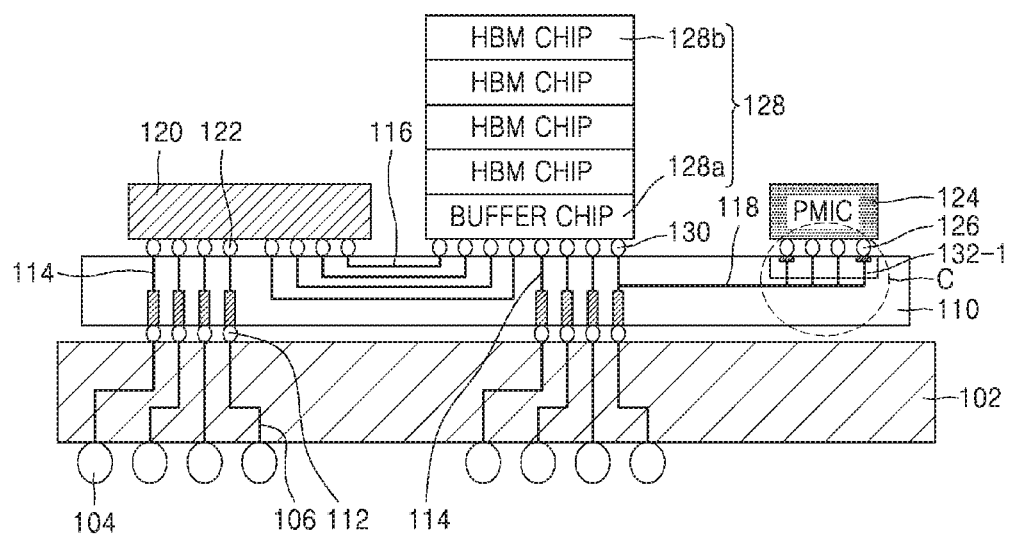
FIG. 7 is a cross-sectional view of an example of an electronic device package according to the inventive concept.
Figure 8:
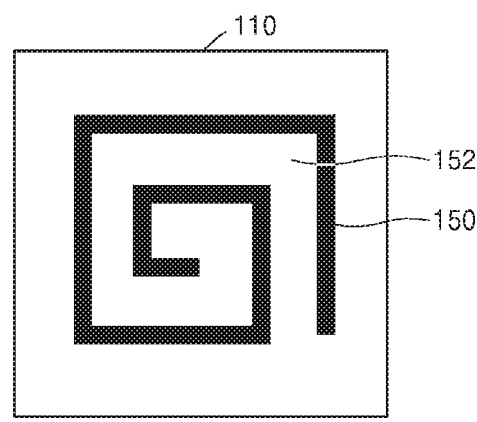
FIGS. 8 and 9 are enlarged views of portion "C" of the electronic device package of FIG. 7.
Figure 9:
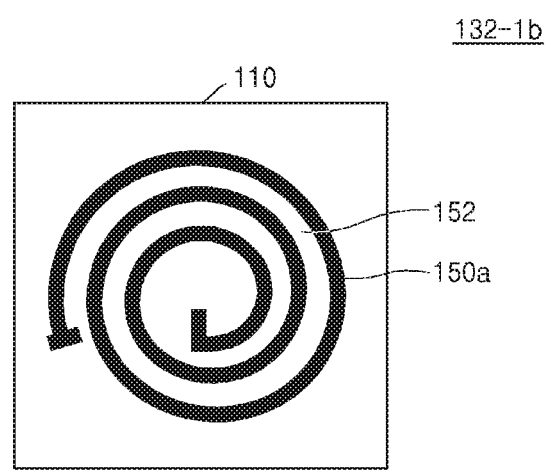

FIG. 7 illustrates a major portion of an electronic device package 200 according to the inventive concept. FIGS. 8 and 9 are enlarged views of portion "C" of the electronic device package of FIG. 7.

The electronic device package 200 may be the same as the electronic device package 100 of FIG. 1, except for the location of the PMIC device 124 and the shape of a passive device 132-1. Referring to FIG. 7, descriptions that are the same as those made in connection with FIG. 1 will be omitted or briefly provided herein.

In the electronic device package 200, the interposer 110 is located above the package substrate 102. The processing device 120, the HBM device 128, and the PMIC device 124 are provided above the interposer 110. The PMIC device 124 may be located at a side of the HBM devices 128.

The passive device 132-1, e.g., an inductor 132-*la* or an inductor 132-1*b* illustrated in FIGS. 8 and 9, may be disposed inside the interposer 110 below the PMIC device 124. The passive device 132-1, e.g., an inductor, may be provided immediately below the PMIC device 124. When the passive device 132-1 is provided immediately below the PMIC device 124 as described above, the performance of the inductor inside the electronic device package 200 may be improved.

The inductor 132-1*a* illustrated in FIG. 8 may include a rectangular, spiral interconnection pattern layer 150 on an insulating layer 152 of the interposer 110. The inductor 132-1*b* illustrated in FIG. 9 may include a circular, loop or spiral interconnection pattern layer 150*a* on the insulating layer 152 of the interposer 110. Unlike FIG. 1, the inductor 132-1 does not include through-silicon vias passing through the interposer 110. Accordingly, the inductor 132-1 may be easily disposed inside the interposer 110.

As described above, in the electronic device package 200 according to the inventive concept, an intermediate structure consisting of the interposer 110 is interposed between the package substrate 102 and both the processing device 120 and the HBM device 128. More particularly, the PMIC device 124, the processing device 120, and the HBM device 128 may be mounted above the interposer 110, and the passive device 132-1 may be easily disposed inside the interposer 110. Accordingly, the footprint of the mounting area across which components are disposed on the package substrate 102 of the electronic device package 200 is minimized, and power may be provided stably (e.g., to the processing and high bandwidth memory devices within the electronic device package 200), thereby maximizing its performance.

Figure 10:
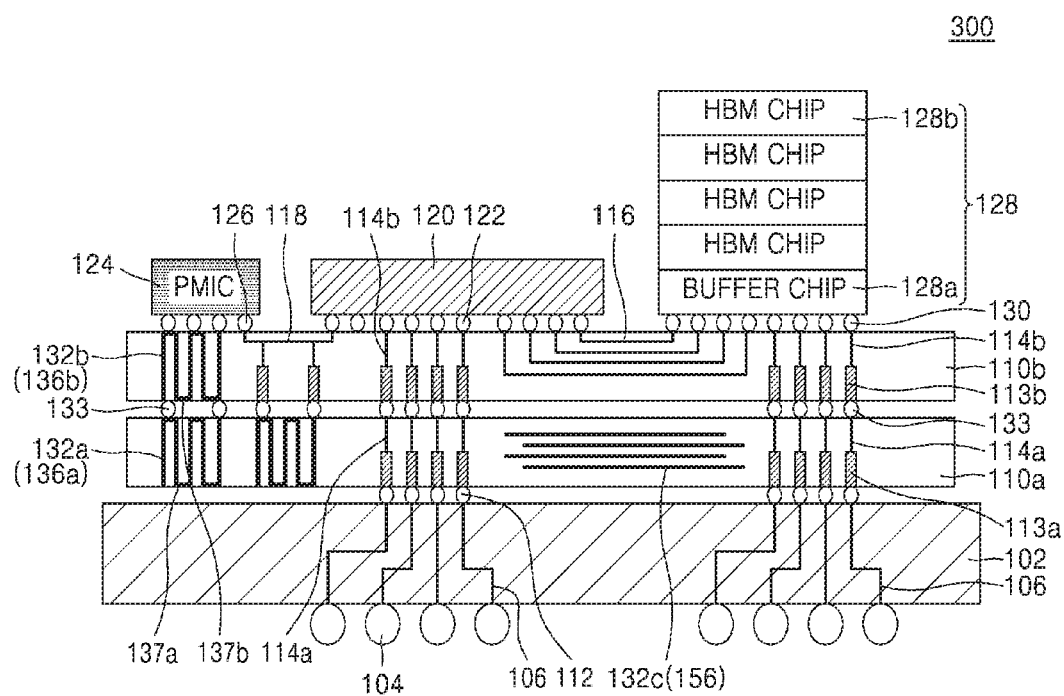
FIG. 10 is a cross-sectional view of an example of an electronic device package according to the inventive concept.

FIG. 10 illustrates a major portion of an electronic device package 300 according to the inventive concept.

The electronic device package 300 may be the same as the electronic device package 100 of FIG. 1, except that a plurality of interposers including an upper interposer 110*b* and a lower interposer 110*a*, and a plurality of passive devices including a lower passive device 132*a* and an upper passive device 132*b* are provided. Referring to FIG. 10, descriptions the same as those made in connection with FIG. 1 will be omitted or briefly provided herein.

The electronic device package 300 includes the package substrate 102. The first connection terminal 104 may be disposed under the package substrate 102. The first interconnection layer 106 may be disposed inside the package substrate 102.

The lower interposer 110*a* may be located above the package substrate 102. The lower interposer 110*a* may be electrically connected to the package substrate 102. The lower interposer 110*a* may be a silicon substrate. The second connection terminal 112 may be disposed under the lower interposer 110*a*.

The lower interposer 110*a* may include first through-silicon via 113*a* and second interconnection layer 114*a*. The first through-silicon via 113a may pass through a portion of the lower interposer 110a between a top surface and a bottom surface of the lower interposer 110a. The second interconnection layer 114a may be electrically connected to the first through-silicon via 113a. The first through-silicon via 113a illustrated in FIG. 10 passes through only a portion of the lower interposer 110a between the top and bottom surfaces of the lower interposer 110a. However, in another example, the first through-silicon via 113a passes completely through the lower interposer 110a between the top surface and the bottom surface thereof.

The lower passive device 132a may be disposed inside the lower interposer 110a. The lower passive device 132a may be a lower inductor. The lower passive device 132a may include a plurality of second through-silicon vias 136a passing between the top and bottom surfaces of the lower interposer 110a and a first redistribution layer 137a connecting the second through-silicon vias 136a.

A lower passive device 132c, e.g., a capacitor, may be disposed inside the lower interposer 110a. The capacitor may include a plurality of interconnection pattern layers 156 disposed inside the lower interposer 110a. The lower passive device 132c configured as a capacitor may be electrically connected to the lower passive device 132a configured as an inductor via the second interconnection layer 114a.

The upper interposer 110b may be located above the lower interposer 110a. The upper interposer 110b may be electrically connected to the lower interposer 110a via a fifth connection terminal 133. The upper interposer 110b may have a structure similar to that of the lower interposer 110a. The upper interposer 110b may include the third through-silicon via 113b and the fourth interconnection layer 114b.

The third through-silicon via 113b may pass through a portion of the upper interposer 110b between a top surface and a bottom surface of the upper interposer 110b. The fourth interconnection layer 114b may be electrically connected to the third through-silicon via 113b. The third through-silicon via 113b illustrated in FIG. 10 passes through only a portion of the lower interposer 110a between the top and bottom surfaces of the upper interposer 110b. However, in another example, the third through-silicon via 113b passes completely through the upper interposer 110b between the top and bottom surfaces thereof.

The upper passive device 132b may be disposed inside the upper interposer 110b. The upper passive device 132b may be an upper inductor. The upper passive device 132b may include a plurality of fourth through-silicon vias 136b passing between the top and bottom surfaces of the upper interposer 110b, and a second redistribution layer 137b connecting the fourth through-silicon vias 136b.

The processing device 120 may be located above the upper interposer 110b, and may be electrically connected to the upper interposer 110b via the third connection terminal 122. The processing device 120 may be a control chip that controls the electronic device package 300.

The HBM device 128 is mounted above the upper interposer 110b, and is electrically connected to the processing device 120 via the third interconnection layer 116. The HBM device 128 may be electrically connected to the upper interposer 110b via the fourth connection terminal 130. The HBM device 128 may be a stack of chips including the buffer chip 128a and the HBM chip 128b, and these chips may be connected via a chip through-silicon via (see 140 of FIG. 5).

The PMIC device 124 may be located above the upper interposer 110b, and may be electrically connected to the upper interposer 110b and the processing device 120 via the third interconnection layer 118. The PMIC device 124 may be connected to the upper passive device 132b located therebelow via the fifth connection terminal 126. The upper passive device 132b may be connected to the lower passive device 132a via the fifth connection terminal 133.

The PMIC device 124 provides power and controls power to the processing device 120 and the HBM device 128. When the upper passive device 132b and the lower passive device 132a are connected to the PMIC device 124, power may be controllable and stably supplied to the processing device 120 and the HBM device 128, and the supplied power may be controlled.

When the upper passive device 132b and the lower passive device 132a, e.g., inductors, are provided immediately below the PMIC device 124, the performance of an inductor inside the electronic device package 300 may be improved. In some examples, the upper passive device 132b and the lower passive device 132a are disposed in areas other than the area immediately below the PMIC device 124.

As described above, In the electronic device package 300 according to the inventive concept, an intermediate structure including the lower and upper interposers 110a and 110b is interposed between the package substrate 102 and both the processing device 120 and the HBM device 128. More particularly, in the electronic device package 300, the PMIC device 124, the processing device 120, and the HBM device 128 are mounted on the upper interposer 110b, and the passive devices 132a, 132b, and 132c are disposed inside the lower interposer 110b and the upper interposer 110a. Accordingly, the footprint of the mounting area across which components are disposed on the package substrate 102 of the electronic device package 300 is minimized, and power may be provided stably (to the processing device of the electronic device package 300), thereby maximizing its performance.

Figure 11:
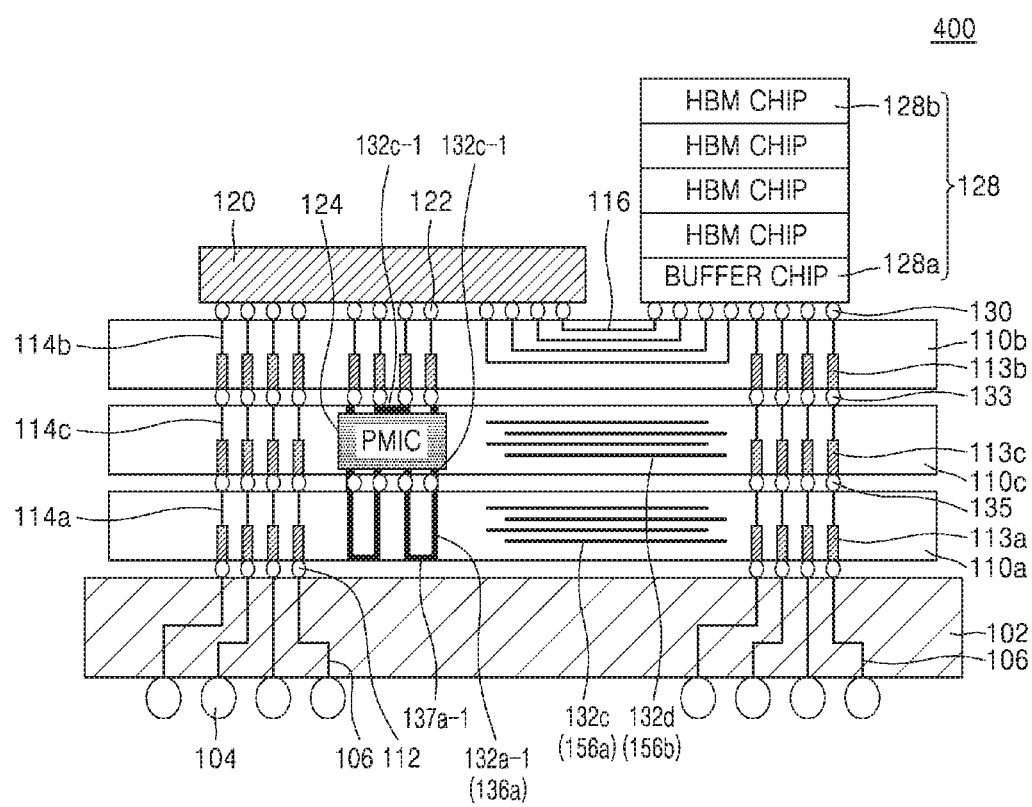
FIG. 11 is a cross-sectional view of an example of an electronic device package according to the inventive concept.

FIG. 11 illustrates a major portion of an electronic device package 400 according to the inventive concept.

The electronic device package 400 may be the same as the electronic device package 100 of FIG. 1, except that a plurality of interposers including the upper interposer 110b, the lower interposer 110a, and an intermediate interposer 110c are provided, a plurality of passive devices 132a, 132c, and 132d are provided, and the PMIC device 124 is disposed within any one of the interposers. Referring to FIG. 11, descriptions that are the same as those made in connection with FIG. 1 will be omitted or briefly provided herein.

The electronic device package 400 includes the package substrate 102. The first connection terminal 104 may be disposed under the package substrate 102. The first interconnection layer 106 may be disposed inside the package substrate 102.

The lower interposer 110a may be located above the package substrate 102. The lower interposer 110a may be electrically connected to the package substrate 102. The lower interposer 110a may be a silicon substrate. The second connection terminal 112 may be disposed under the lower interposer 110a.

The lower interposer 110a may include the first through-silicon via 113a and the second interconnection layer 114a. The first through-silicon via 113a may pass through a portion of the lower interposer 110a between a top surface and a bottom surface of the lower interposer 110a. The second interconnection layer 114a may be electrically connected to the first through-silicon via 113a.

A lower passive device 132a-1 may be disposed inside the lower interposer 110a. The lower passive device 132a-1 may be a lower inductor. The lower passive device 132a-1, that is, the lower inductor, may include the second through-silicon vias 136a passing between top and bottom surfaces of the lower interposer 110a, and a first redistribution layer 137a-1 connecting the second through-silicon vias 136a.

The lower passive device 132c, e.g., a capacitor, may be disposed inside the lower interposer 110a. The capacitor may include a plurality of interconnection pattern layers 156a disposed inside the lower interposer 110a. The lower passive device 132c configured as a capacitor may be electrically connected to the lower passive device 132a-1 configured as an inductor via the second interconnection layer 114a.

The intermediate interposer 110c may be located above the lower interposer 110a. The intermediate interposer 110c may be electrically connected to the lower interposer 110a via a sixth connection terminal 135. The intermediate interposer 110c may have a structure similar to that of the lower interposer 110a, but the PMIC device 124 may be located inside the intermediate interposer 110c.

The intermediate interposer 110c may include a fifth through-silicon via 113c and a fifth interconnection layer 114c. The fifth through-silicon via 113c may be a via interconnection layer that passes through a portion of the intermediate interposer 110c between a top surface and a bottom surface of the intermediate interposer 110c. The fifth interconnection layer 114c may be electrically connected to the fifth through-silicon via 113c.

An intermediate passive device 132c-1 may be disposed inside the intermediate interposer 110c. The intermediate passive device 132c-1 may be an intermediate inductor. The intermediate passive device 132c-1, that is, the intermediate inductor, may be a coil surrounding the PMIC device 124. The intermediate passive device 132c-1 may be electrically connected to the lower passive device 132a-1 via the sixth connection terminal 135.

The PMIC device 124 may be connected to the lower passive device 132a-1 via the intermediate passive device 132c-1 and the sixth connection terminal 135. The PMIC device 124 provides and controls power to the processing device 120 and the HBM device 128. When the lower passive device 132a-1 is connected to the PMIC device 124, power may be controllable and stably provided to the processing device 120 and the HBM device 128.

A lower passive device 132d, e.g., a capacitor, may be disposed inside the intermediate interposer 110c. The capacitor may include a plurality of interconnection pattern layers 156b disposed inside the intermediate interposer 110c. The lower passive device 132d configured as a capacitor may be electrically connected to the lower passive device 132c configured as an inductor via the fifth interconnection layer 114c.

The upper interposer 110b may be located above the intermediate interposer 110c. The upper interposer 110b may be electrically connected to the intermediate interposer 110c via the fifth connection terminal 133. The upper interposer 110b may include the third through-silicon via 113b and the fourth interconnection layer 114b.

The third through-silicon via 113b may be a via interconnection layer that passes through a portion of the upper interposer 110b between a top surface and a bottom surface of the upper interposer 110b. The fourth interconnection layer 114b may be electrically connected to the third through-silicon via 113b.

The processing device 120 may be located above the upper interposer 110b, and may be electrically connected to the upper interposer 110b via the third connection terminal 122. The processing device 120 may be a control chip that controls the electronic device package 400.

The HBM device 128 is mounted above the upper interposer 110b, and is electrically connected to the processing device 120 via the third interconnection layer 116. The HBM device 128 may be electrically connected to the upper interposer 110b via the fourth connection terminal 130. The HBM device 128 may be a stack of chips including the buffer chip 128a and the HBM chip 128b, and these chips may be connected via a chip through-silicon via (see 140 of FIG. 5).

As described above, in the electronic device package 400 according to the inventive concept, an intermediate structure including the lower interposer 110a, the intermediate interposer 100b and the upper interposer 100c is interposed between the package substrate 102 and both the processing device 120 and the HBM device 128. More particularly, in the electronic device package 400 according to an example of the inventive concept, the processing device 120 and the HBM device 128 are mounted on the upper interposer 110b; the PMIC device 124 is provided inside the intermediate interposer 110c, and the passive devices 132a-1, 132c-1, 132c, and 132d are provided inside the lower, upper, and intermediate interposers 110a and 110c.

Accordingly, the footprint of the mounting area across which components are disposed on the package substrate 102 of the electronic device package 400 is minimized, and power may be provided stably (e.g., to the processing and high bandwidth memory devices within the electronic device package 400, thereby maximizing its performance.

FIG. 11 illustrates an example having one intermediate interposer 110c. However, other examples include two or more intermediate interposers.

Figure 12:
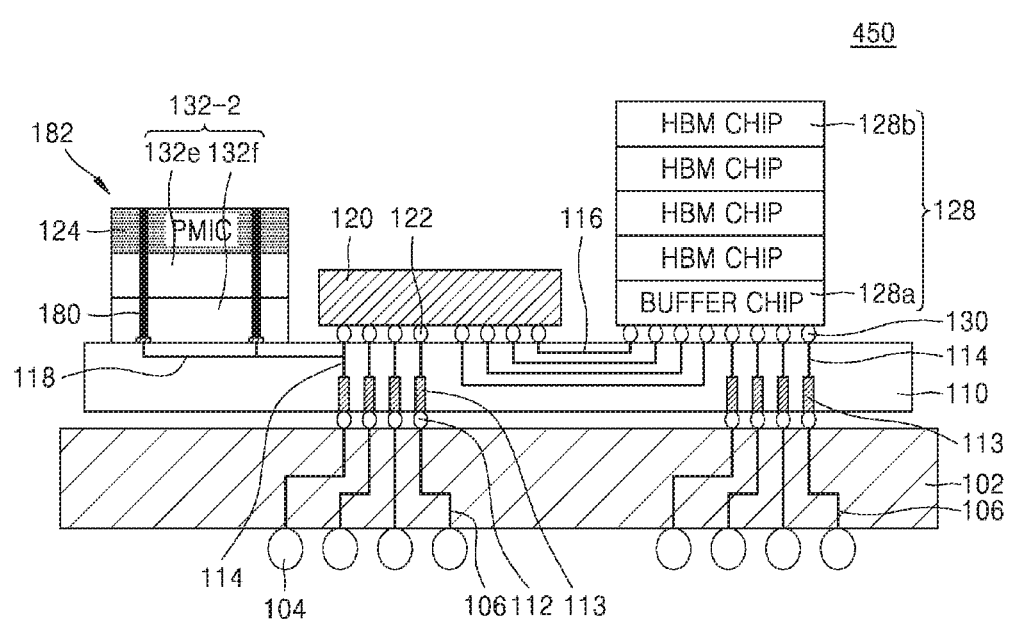
FIG. 12 is a cross-sectional view of an example of an electronic device package according to the inventive concept.

FIG. 12 illustrates a major portion of an electronic device package 450 according to the inventive concept.

The electronic device package 450 may be the same as the electronic device package 100 of FIG. 1, except that the PMIC device 124 and a passive device 132-2 including an inductor 132e and a capacitor 132f are integrally provided as an integrated device 182. Referring to FIG. 12, descriptions that are the same as those made in connection with FIG. 1 will be omitted or briefly provided herein.

In the electronic device package 450, the interposer 110 may be located above the package substrate 102. The interposer 110 may be electrically connected to the package substrate 102. The interposer 110 may include the first through-silicon via 113 and the second interconnection layer 114. The first through-silicon via 113 may pass through a portion of the interposer 110 between a top surface and a bottom surface of the interposer 110. The second interconnection layer 114 may be electrically connected to the first through-silicon via 113.

The interposer 110 may include the third interconnection layer 116. The third interconnection layer 116 may be electrically connected to the second interconnection layer 114. The processing device 120 may be located above the interposer 110, and may be electrically connected to the interposer 110 via the third connection terminal 122. The processing device 120 may be a control chip that controls the electronic device package 450.

The HBM device 128 is mounted above the interposer 110, and is electrically connected to the processing device 120 via the third interconnection layer 116. The integrated device 182 is located above the interposer 110. The integrated device 182 may be electrically connected to the processing device 120 via the interposer 110. The integrated device 182 may be a single integrated device in which the PMIC device 124 is integrally disposed with the passive device 132-2 including the inductor 132e and the capacitor 132f. The integrated device 182 including the PMIC device 124 and the passive device 132-2 may have a sixth through-silicon via 180be electrically connecting the PMIC device 124 and the passive device 132-2 to the interposer 110.

As described above, the PMIC device 124 may provide and control power to the processing device 120 and the HBM device 128. When the lower passive device 132-2 is directly connected to the PMIC device 124, power may be controllable and stably provided to the processing device 120 and the HBM device 128.

In the electronic device package 450 according to the inventive concept, an intermediate structure including the at least one interposer 110 is interposed between the package substrate 102 and both the processing device 120 and the HBM device 128. More particularly, in the electronic device package 450 according to the inventive concept, the integrated device 182 (passive device 132-2 integrated with the PMIC device 124), the processing device 120, and the HBM device 128 may be mounted on the interposer 110. Accordingly, the footprint of the mounting area across which components are disposed on the package substrate 102 of the electronic device package 450 is minimized, and power may be provided stably (e.g., to the processing and high bandwidth memory devices within the electronic device package 100), thereby maximizing its performance.

Figure 13A:
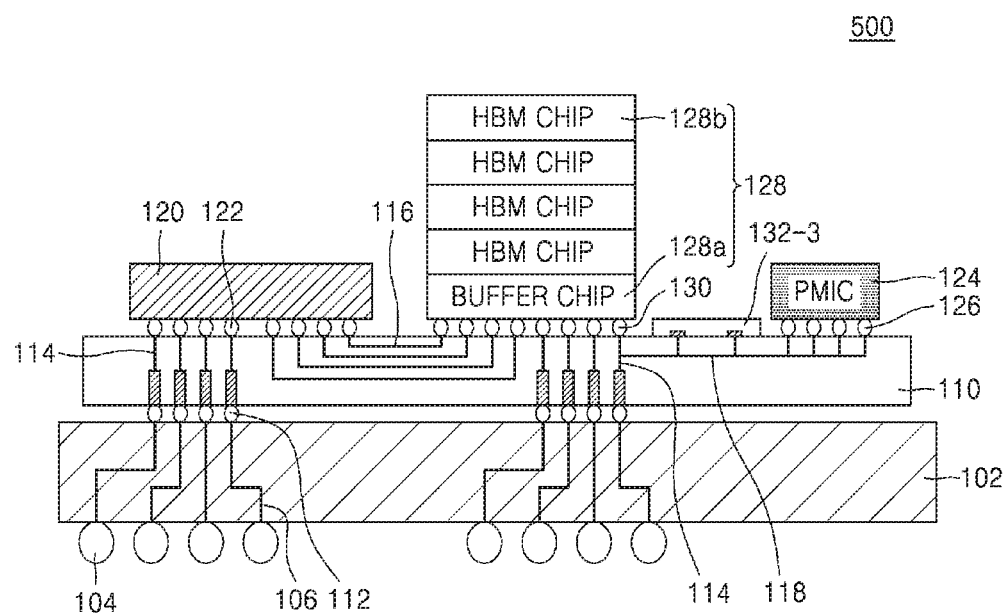
FIG. 13A is a cross-sectional view of an example of an electronic device package according to the inventive concept.
Figure 13B:
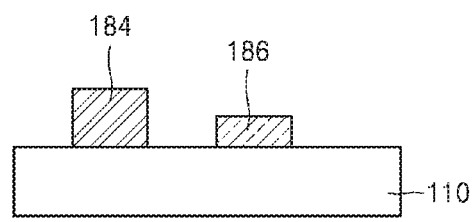
FIG. 13B is a cross-sectional view of a passive device of the electronic device package illustrated in FIG. 13A.

FIG. 13A illustrates a major portion of an electronic device package 500 according to the inventive concept. FIG. 13B is a cross-sectional view of a passive device 132-3 of the electronic device package 500 illustrated in FIG. 13A.

The electronic device package 500 may be the same as the electronic device package 200 of FIG. 7, except for the shape of the passive device 132-3. Referring to FIGS. 13A and B, descriptions which are the same as those made in connection with FIG. 7 will be omitted or briefly provided herein.

In the electronic device package 500, the interposer 110 is located above the package substrate 102. The processing device 120, the HBM device 128, and the PMIC device 124 are provided on the interposer 110. The PMIC device 124 may be located at a side of the HBM devices 128.

The passive device 132-3 is located above the interposer 110 at a side of the PMIC device 124. The passive device 132-3 may be, as illustrated in FIG. 13B, constituted by a bump pattern 184 or a redistribution pattern 186, disposed on the interposer 110. The bump pattern 184 and the redistribution pattern 186 may each have, like the examples described in connection with FIGS. 8 and 9, a rectangular or circular spiral pattern. Unlike the example of FIG. 7, the passive device 132-3, e.g., an inductor, of this example is disposed on the interposer 110.

As described above, in the electronic device package 500 according to the inventive concept, an intermediate structure consisting of the interposer 110 is interposed between the package substrate 102 and both the processing device 120 and the HBM device 128. More particularly, regarding the electronic device package 500, the PMIC device 124, the processing device 120, and the HBM device 128 may be mounted on the interposer 110, and the passive device 132-3 may be easily disposed on the interposer 110. Accordingly, the footprint of the mounting area across which components are disposed on the package substrate 102 of the electronic device package 100 is minimized, and power may be provided stably (e.g., to the processing and high bandwidth memory devices within the electronic device package 500), thereby maximizing its performance.

Figure 14A:
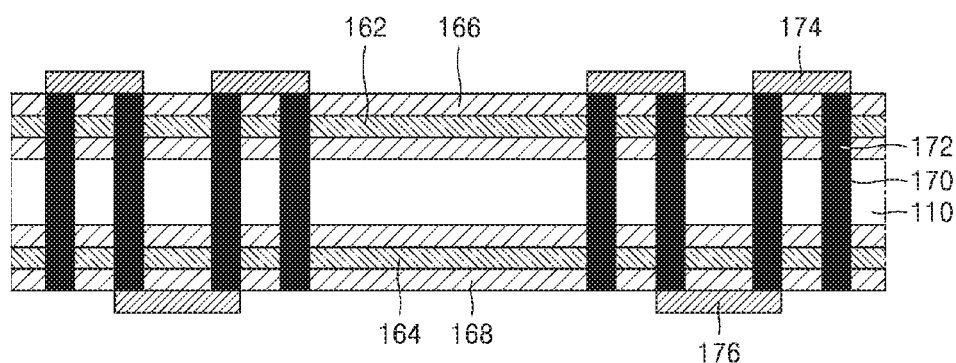
FIGS. 14A and 14B are respectively a partial cross-sectional view and a partial plan view of a passive device that can be used in an electronic device package according to the inventive concept.
Figure 14B:
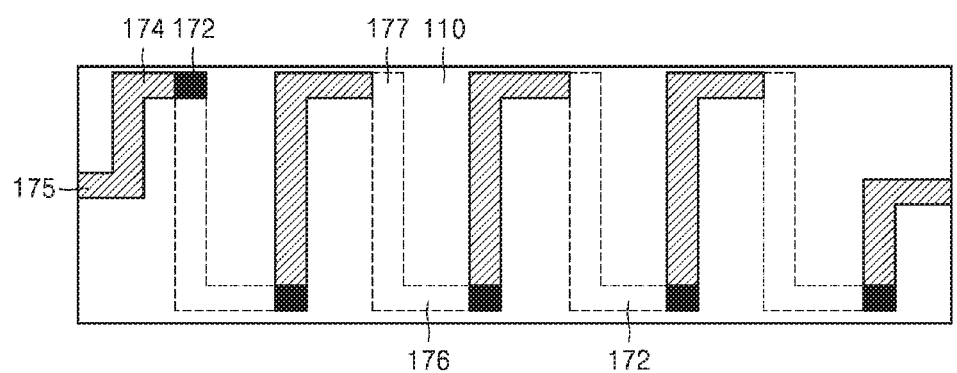

FIGS. 14A and 14B are a partial cross-sectional view and a partial plan view of a passive device 132-4, e.g., an inductor that can be used in electronic device packages according to the inventive concept.

In particular, any of the electronic device packages 100, 300, and 400 may employ the passive device 132-4. The passive device 132-4 may include an upper magnetic layer 162, a lower magnetic layer 164, and through-silicon vias 172 connecting the upper magnetic layer 162 to the lower magnetic layer 164.

As illustrated in FIG. 14A, in an upper portion of the interposer 110, the upper magnetic layer 162 may be disposed between upper insulating layers 166. In a lower portion of the interposer 110, the lower magnetic layer 164 may be disposed between lower insulating layers 168. The upper magnetic layer 162 may be connected to the lower magnetic layer 164 via the through-silicon vias 172 filling a through-hole 170 passing through the upper and lower portions of the interposer 110. In some examples, interconnection pads 174 and 176 are disposed above the upper magnetic layer 162 or below the lower magnetic layer 164.

As illustrated in the plan view of FIG. 14B, an upper interconnection layer 175 including the interconnection pad 174 may be located on a top surface of the interposer 110, and a lower interconnection layer 177 including the interconnection pad 176 may be located on a lower surface of the interposer 110. The upper interconnection layer 175 may be electrically connected to the lower interconnection layer 177 via the through-silicon vias 172.

Figure 15:
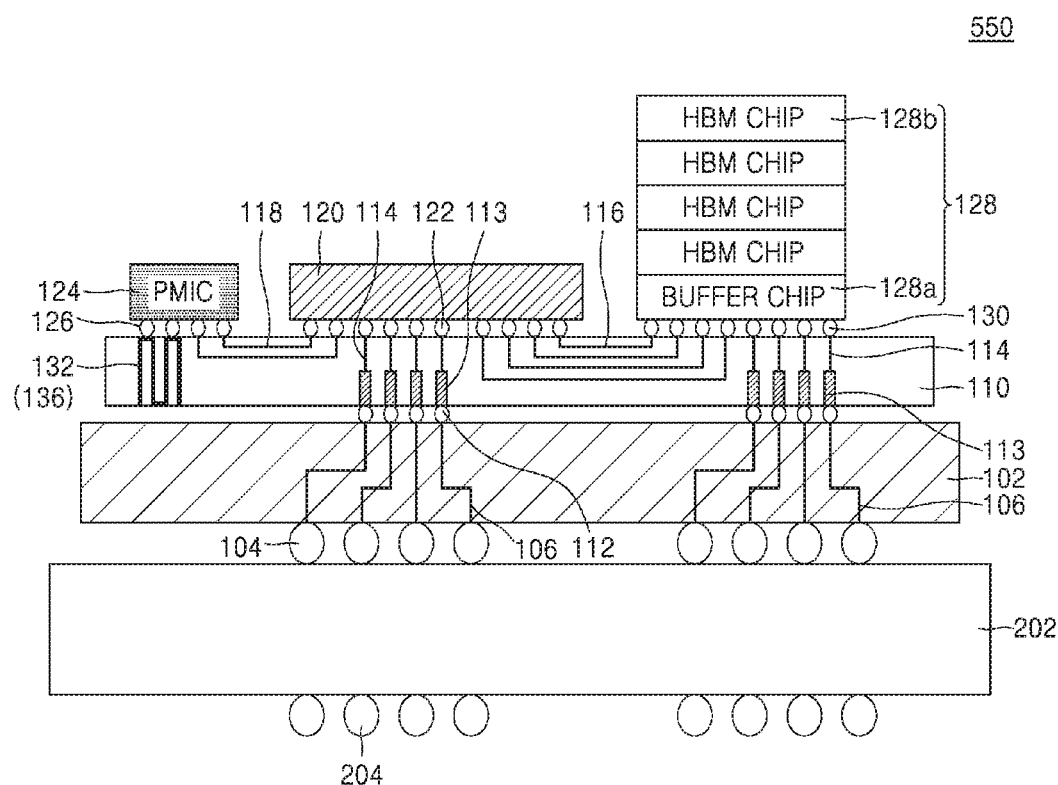
FIG. 15 is a cross-sectional view of an example of an electronic device package according to an example of the inventive concept.

FIG. 15 illustrates a major portion of an electronic device package 550 according to the inventive concept.

The electronic device package 550 may be the same as the electronic device package 100 of FIG. 1, except that the package substrate 102, on which the interposer 110, the processing device 120, the HBM device 128, the PMIC device 124, and the passive device 132 are mounted, is mounted on a mother board 202. Referring to FIG. 15, descriptions that are the same as those made in connection with FIG. 1 will be omitted or briefly provided herein.

In the electronic device package 550, the interposer 110 is located above the package substrate 102. The passive device 132 may be located inside the interposer 110. The processing device 120, the HBM device 128, and the PMIC device 124 are provided on the interposer 110. The PMIC device 124 may be located beside the HBM devices 128.

In the electronic device package 550, the package substrate 102, on which the interposer 110, the processing device 120, the HBM device 128, the PMIC device 124, and the passive device 132 are mounted, is mounted on the mother board 202, and the package substrate 102 is electrically connected to the mother board 202 via the first connection terminal 104. An external connection terminal 204 may be further provided under the mother board 202.

As described above, In the electronic device package 550 according to the inventive concept, an intermediate structure including the at least one interposer 110 is interposed between the package substrate 102 and both the processing device 120 and the HBM device 128. More particularly, in the electronic device package 550, the passive device 132, the PMIC device 124, the processing device 120, and the HBM device 128 are mounted on the interposer 110 on the package substrate 102, and these electronic elements are mounted on the mother board 202. Accordingly, the footprint of the mounting area across which components are disposed on the package substrate 102 of the electronic device package 550 is minimized, and power may be provided stably (e.g., to the processing and high bandwidth memory devices within the electronic device package 550), thereby maximizing its performance.

Figure 16:
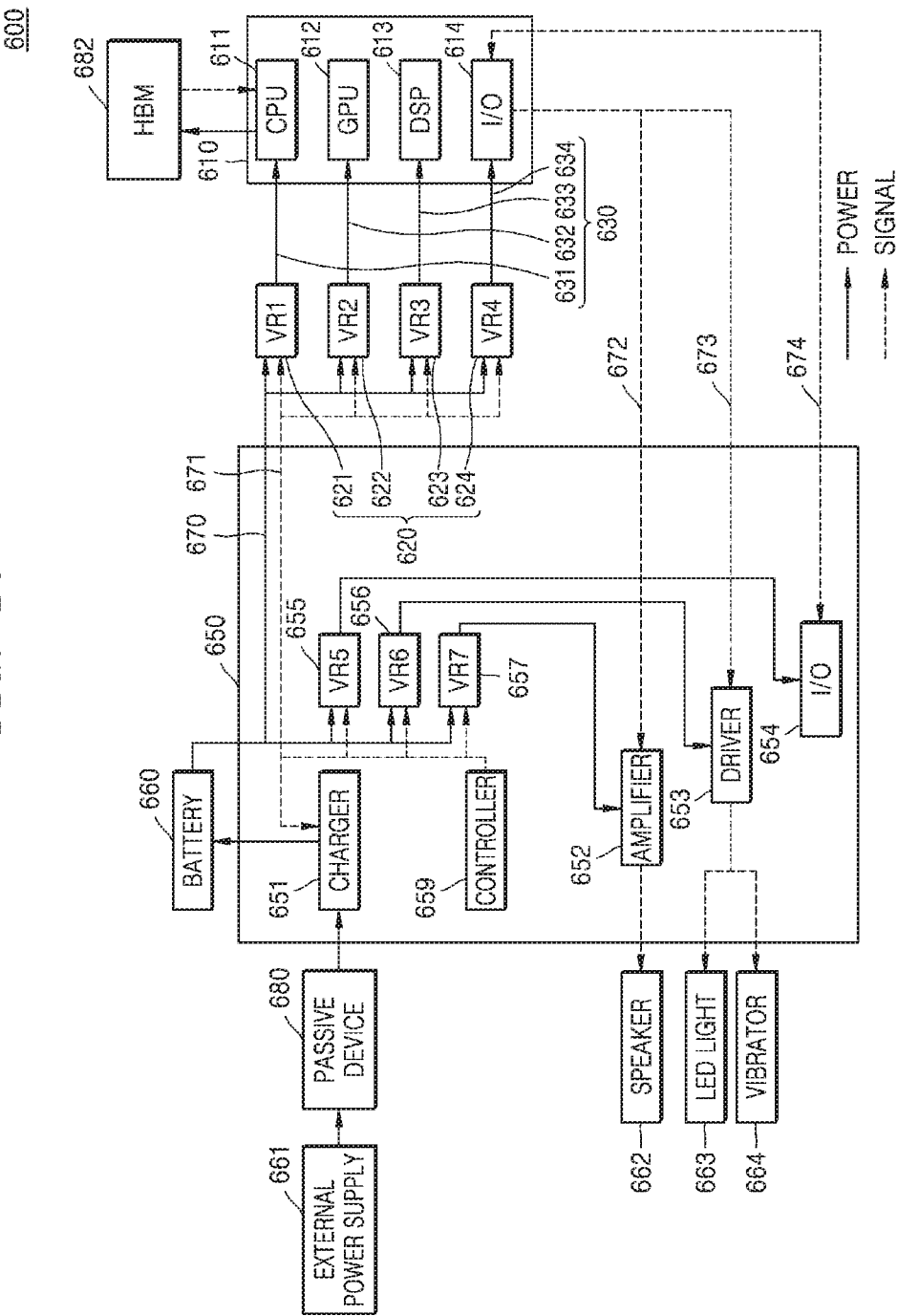
FIG. 16 is a block diagram of an electronic system including an electronic device package according to the inventive concept.

FIG. 16 is a block diagram illustrating an example of an electronic system 600 including an electronic device package according to the inventive concept.

The electronic system 600 may include a PMIC device 650, a passive device 680, a processing device 610, and an HBM device 682. The PMIC device 650 may correspond to the PMIC device 124 illustrated in and described with reference to the preceding drawings. The passive device 680 may correspond to the passive device 132 illustrated in and described with reference to the preceding drawings. The processing device 610 may correspond to the processing device 120 illustrated in and described with reference to the preceding drawings.

The HBM device 682 may correspond to the HBM device 128 illustrated in and described with reference to the preceding drawings. The PMIC device 650, the passive device 680, the processing device 610, and the HBM device 682 may be embodied inside or above an interposer of a package substrate.

The electronic system 600 may include a power supply chip 620 including voltage regulators VR1 621 to VR4 624. The power supply chip 620 may be connected to the processing device 610. The processing device 610 may be electrically connected to the HBM device 682. The processing device 610 and the power supply chip 620 may be electrically connected to the PMIC device 650. The processing device 610 may include a central processing unit (CPU) 611, a graphics processing unit (GPU) 612, a digital signal processor (DSP) 613, and an input/output (I/O) module 614. The processing device 610 may include an application processor (AP). The AP may be configured as a wireless communication application or an ASIC.

The power supply chip 620 may be electrically connected to the processing device 610 to provide power thereto. For example, the power supply chip 620 may be electrically connected to the CPU 611, GPU 612, DSP 613, and I/O module 614 of the processing device 610 via a power connection 630 including power connections 631 to 634 to provide power thereto. However, the power supply chip 620 is optional, i.e., may be omitted in certain applications in accordance with the inventive concept.

The processing device 610 may have various power supply characteristics. For example, an operating voltage of the CPU 611 may be different from an operating voltage of the I/O module 614. In one or more examples, the operating voltage of the CPU 611 may be lower than the operating voltage of the I/O module 614. For example, a power supply voltage of the I/O module 614 may have a voltage variation greater than that of the CPU 611. In one example, the CPU 611 may be operated in a different mode with different operating voltages, such as a high performance mode with a higher voltage and a power saving mode with a lower operating voltage.

The power supply chip 620 may include voltage regulators VR1 621 to VR4 624 to match the power supply characteristics of electronic components that constitute the processing element 610. The voltage regulators VR1 621 to VR4 624 may be configured according to power supply characteristics. For example, when a power supply voltage is supplied to the voltage regulators VR1 621 to VR4 624 through the PMIC device 650 from a battery, the voltage regulators VR1 621 to VR4 624 may adjust the voltage level of the power supply voltage to generate different power supply voltages in corresponding electronic elements 611 to 614. In an example, the voltage regulators may include a linear voltage regulator, a switching voltage regulator, a buck converter, and the like.

The PMIC device 650 may provide and control power to the power supply chip 620 and the processing device 610. In one example, the PMIC device 650 may include a charger 651, an amplifier 652, a driver 653, an I/O module 659, voltage regulators VR5 655 to VR7 657, and a controller 659.

The charger 651 may be configured to charge a rechargeable battery 660 by using power provided by an external power supply 661 when the external power supply 661 is electrically connected to the PMIC device 650 through the passive device 680. In one example, the external power supply 661 may be electrically connected to the charger 651 via a universal serial bus (USB) having a voltage of, for example, 5V. The amplifier 652 may be configured to drive a speaker 662. The driver 653 may be configured to drive various external devices such as a light-emitting diode (LED) light 663 and a vibrator 664.

In one example, the LED light 663 may be a display light source of a wireless communication device, such as a cell phone. The I/O module 654 may be configured to input or output data between the PMIC device 650 and the processing device 610, and between the PMIC device 650 and other external circuitry. The voltage regulators 655 to 657 may be configured to provide power to the amplifier 652, the driver 653, and the I/O module 654 by using power provided from the battery 660.

In one example, when the external power supply 661 is electrically connected to the PMIC device 650, one or more of the voltage regulators 655 to 657 may receive power provided by the external power supply unit 661, in place of or in addition to power provided from the battery 660. The controller 659 may be configured to control the operation of one or more other elements in the PMIC device 650. In one example, the controller 659 may be configured to control the operation of the charger 651 and the voltage regulators 655 to 657.

In one example, the charger 651 may be embodied as an external element outside the PMIC device 650. In some examples, one or more of elements constituting the PMIC device 650 may be omitted. The PMIC device 650 may be electrically coupled to the processing device 610 and at least one of the voltage regulators VR1 621, VR2 622, VR3 623, and VR4 624. In one example, the PMIC device 650 may be electrically connected to the at least one of the voltage regulators VR1 621, VR2 622, VR3 623, and VR4 624 through a power connection 670 and a signal connection 671.

The PMIC device 650 may be electrically connected to the processing device 610 through signal connections 672 to 674 for signal communication between the I/O module 614 of the processing device 610 and each of the amplifier 652, the driver 653, and the I/O module 659. The PMIC device 650 may be configured to provide at least one of power or a control signal to the at least one of the voltage regulators VR1 621, VR2 622, VR3 623, and VR4 624.

In one example, power may be transferred from the battery 660 to at least one of the voltage regulators VR1 621, VR2 622, VR3 623, and VR4 624 via the PMIC device 650 and the power connection 670, and then, from a voltage regulator of the at least one of the voltage regulators VR1 621, VR2 622, VR3 623, and VR4 624 to the processing element 610. In one example, at least one control signal may be generated by the controller 659 and provided via the signal connection 671 to the at least one of the voltage regulators VR1 621, VR2 622, VR3 623, and VR4 624.

Figure 17:
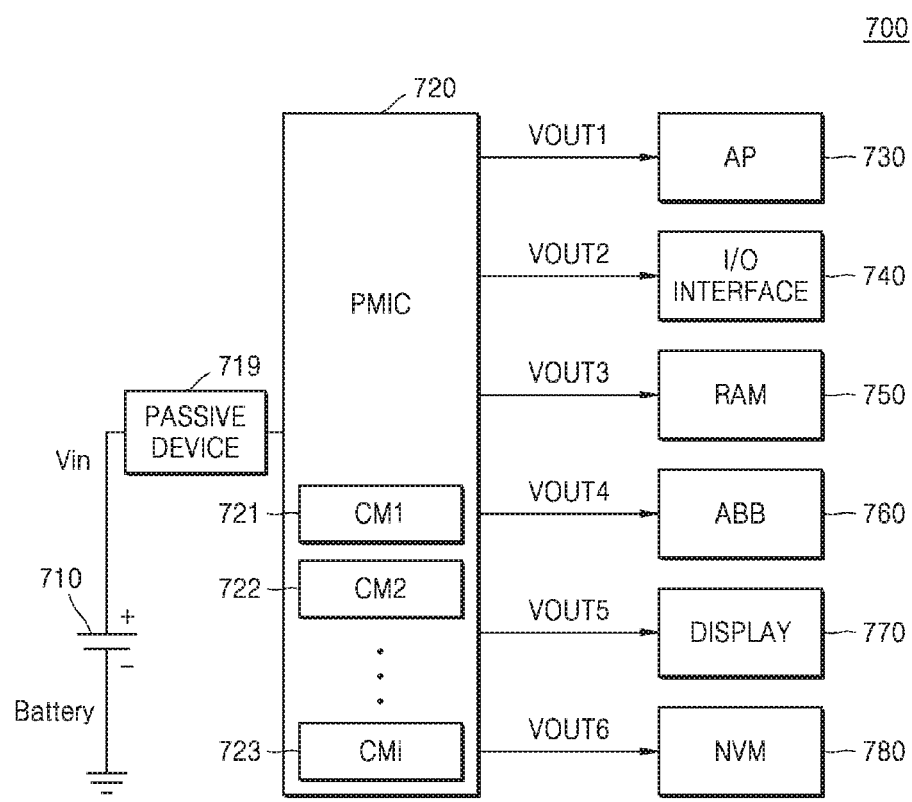
FIG. 17 is a block diagram of an electronic system including an electronic device package according to the inventive concept.

FIG. 17 is a block diagram of an example of an electronic system 700 including an electronic device package according to the inventive concept.

Referring to FIG. 17, the electronic system 700 may include a PMIC device 720, a passive device 719, an application processor 730, and a random-access memory (RAM) device 750. The PMIC device 720 may correspond to the PMIC device 124 illustrated in and described with reference to the preceding drawings. The passive device 719 may correspond to the passive device 132 illustrated in and described with reference to the preceding drawings. The application processor 730 may correspond to the processing device 120 illustrated in and described with reference to the preceding drawings.

The RAM device 750 may correspond to the HBM device 128 illustrated in and described with reference to the preceding drawings. As in the above descriptions, the PMIC device 720, the passive device 719, the application processor 730, and the RAM device 750 may be embodied inside or above an interposer of a package substrate.

The electronic system 700 may include a battery 710, the passive device 719, the PMIC device 720, the application processor 730, an input/output interface 740, the RAM device 750, an analog baseband chipset 760, a display 770, and a non-volatile memory 780.

The PMIC device 720 may convert a power supply voltage VDD, that is, an input voltage Vin supplied from the battery 710 through the passive device 719, to various levels Vout1 to Vout6 to provide charge to various devices. The PMIC device 720 may include a plurality of voltage regulators.

The voltage regulators may include switching regulators. The voltage regulators may include current meters 721 to 723. However, the current meters 721 to 723 are optional, i.e., in some examples the current meters 721 to 723 are omitted. The PMIC device 720 may provide load current information which is measured in response to the request of at least one of load devices.

In an electronic device package according to the inventive concept, an interposer is located above a package substrate, a power management integrated circuit device is mounted above or inside the interposer, a memory device is mounted above the interposer, and a passive device, such as an inductor or a capacitor, is disposed directly on the interposer or inside the body of the interposer.

The electronic device package having such a structure may allow for a smaller mounting area for the components and allow power to be provided stably, thereby providing high performance.

Although the inventive concept has been particularly shown and described with reference to examples thereof, it will be understood that various changes in form and details may be made to such examples without departing from the spirit of the inventive concept and scope of the following claims.

What is claimed is:

1. An electronic device package comprising:
   a package substrate;
   an interposer located above the package substrate and electrically connected to the package substrate;
   a processing device located above the interposer and electrically connected to the interposer;
   at least one high bandwidth memory device located above the interposer and electrically connected to the interposer and the processing device;
   a power management integrated circuit device located above the interposer and electrically connected to the interposer and the processing device; and
   a passive device located on or inside the interposer and electrically connected to the power management integrated circuit device,
   wherein the passive device comprises an inductor having an upper magnetic layer and a lower magnetic layer respectively disposed above and under the interposer, through-silicon vias connecting the upper magnetic layer to the lower magnetic layer, and a redistribution layer connecting the through-silicon vias.

2. The electronic device package of claim 1, wherein the passive device comprises the inductor located inside the interposer and below at least a portion of the power management integrated circuit device.

3. The electronic device package of claim 1, wherein the at least one high bandwidth memory device comprises a stack of chips, and a chip through-silicon via connecting the chips.

4. The electronic device package of claim 1, wherein the interposer has an interposer body and a through-via extending through the interposer body and electrically connecting the at least one high bandwidth memory device to the package substrate.

5. The electronic device package of claim 1, wherein the interposer has an interposer body and a through silicon via through-via extending through the interposer body and electrically connecting the processing device to the package substrate.

6. The electronic device package of claim 1, wherein the processing device is laterally spaced from the power management integrated circuit device and the at least one high bandwidth memory device.

7. The electronic device package of claim 6, wherein the interposer has an interposer body, and an interconnection layer in the interposer body and electrically connecting the processing device to the power management integrated circuit device and the at least one high bandwidth memory device.

8. An electronic device package comprising:
   a package substrate including a substrate body having a top surface and a bottom surface;
   first connection terminals disposed on the substrate body and dedicated to electrically connect the electronic device package to an external device;
   second connection terminals disposed on the top surface of the substrate body;
   an interposer disposed on the top surface of the substrate body of the package substrate and electrically connected to the package substrate by the second connection terminals, the interposer including an interposer body and through-vias extending vertically through the interposer body;
   a processor disposed above the interposer and electrically connected to the through-vias of the interposer;
   at least one high bandwidth memory disposed above the interposer and electrically connected to the processor by the interposer;
   a power management integrated circuit electrically connected to the processor; and
   a passive electronic component disposed within the interposer body of the interposer and below at least a portion of the power management integrated circuit device and electrically connected to the power management integrated circuit, wherein the passive electronic component comprises an inductor having an upper magnetic layer and a lower magnetic layer respectively disposed above and under the interposer, through-silicon vias connecting the upper magnetic layer to the lower magnetic layer, and a redistribution layer connecting the through-silicon vias.

9. The electronic device package of claim 8, wherein the interposer has an interconnection layer in the interposer body and electrically connecting the processor to the power management integrated circuit and the at least one high bandwidth memory.

10. An electronic device package comprising:
a package substrate;
a lower interposer located above the package substrate and electrically connected to the package substrate;
an intermediate interposer located above the lower interposer and electrically connected to the lower interposer;
an upper interposer located above the intermediate interposer and electrically connected to the intermediate interposer;
a processing device located above the upper interposer and electrically connected to the upper interposer;
at least one high bandwidth memory device located above the upper interposer and electrically connected to the processing device;
a power management integrated circuit device located inside the intermediate interposer and electrically connected to the upper interposer and the processing device; and
a passive device located inside the lower interposer and the intermediate interposer and electrically connected to the power management integrated circuit device,
wherein the passive device comprises a lower inductor and an intermediate inductor,
wherein the lower inductor comprises a plurality of lower through-silicon vias and a lower redistribution layer that are located inside the lower interposer, the lower redistribution layer connecting the plurality of lower through-silicon vias, and
the intermediate inductor comprises a plurality of intermediate through-silicon vias and an intermediate redistribution layer that are located inside the intermediate interposer, the intermediate redistribution layer connecting the plurality of intermediate through-silicon vias.

11. The electronic device package of claim 10, wherein the at least one high bandwidth memory device is electrically connected to the package substrate through through-silicon vias located inside the lower interposer, the intermediate interposer, and the upper interposer.

12. The electronic device package of claim 10, wherein the processing device is electrically connected to the package substrate through through-silicon vias located inside the lower interposer, the intermediate interposer, and the upper interposer.

* * * * *